(12) United States Patent
Ueda et al.

(10) Patent No.: US 11,500,165 B2
(45) Date of Patent: Nov. 15, 2022

(54) OPTICAL MODULE, OPTICAL WIRING SUBSTRATE, AND METHOD FOR MANUFACTURING OPTICAL MODULE

(71) Applicant: Nippon Telegraph and Telephone Corporation, Tokyo (JP)

(72) Inventors: Yuta Ueda, Musashino (JP); Hiroyuki Ishii, Musashino (JP); Koji Takeda, Musashino (JP); Takushi Kazama, Musashino (JP); Hitoshi Wakita, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/048,272

(22) PCT Filed: Mar. 19, 2019

(86) PCT No.: PCT/JP2019/011438
§ 371 (c)(1),
(2) Date: Oct. 16, 2020

(87) PCT Pub. No.: WO2019/202895
PCT Pub. Date: Oct. 24, 2019

(65) Prior Publication Data
US 2021/0141170 A1    May 13, 2021

(30) Foreign Application Priority Data
Apr. 19, 2018  (JP) .............................. JP2018-080627

(51) Int. Cl.
*G02B 6/42* (2006.01)
*G02B 6/12* (2006.01)

(52) U.S. Cl.
CPC ....... *G02B 6/4214* (2013.01); *G02B 6/12004* (2013.01); *G02B 6/4204* (2013.01);
(Continued)

(58) Field of Classification Search
None
See application file for complete search history.

(56) References Cited

U.S. PATENT DOCUMENTS

| 5,400,419 | A | * | 3/1995 | Heinen | ................ | G02B 6/4246 |
| | | | | | | 385/14 |
| 6,981,804 | B2 | * | 1/2006 | Jian | ........................ | G02B 6/423 |
| | | | | | | 385/88 |

(Continued)

FOREIGN PATENT DOCUMENTS

| JP | 2012-133324 A | 7/2012 |
| JP | 2015-184667 A | 10/2015 |

(Continued)

OTHER PUBLICATIONS

International Search Report and Written Opinion dated Jun. 11, 2019, issued in PCT Application No. PCT/JP2019/011438, filed Mar. 19, 2019.

(Continued)

*Primary Examiner* — Michelle R Connelly
(74) *Attorney, Agent, or Firm* — Workman Nydegger

(57) ABSTRACT

An optical module includes: a substrate; one or more light sources that produce light that is an optical signal; one or more light reflection units that change the direction of travel of the light to a direction substantially perpendicular to the substrate; one or more optical waveguides that optically connect the one or more light sources and the one or more light reflection units to each other; and a lid that is attached to the substrate to cover the one or more light sources, the one or more light reflection units and the one or more optical (Continued)

waveguides. The lid has one or more lenses that collimate light directed by the one or more light reflection units and transmit the light to the outside of the lid.

6 Claims, 8 Drawing Sheets

(52) U.S. Cl.
CPC ........... *G02B 6/425* (2013.01); *G02B 6/4244* (2013.01); *G02B 6/4285* (2013.01)

(56) References Cited

U.S. PATENT DOCUMENTS

| | | | | |
|---|---|---|---|---|
| 7,246,953 | B2* | 7/2007 | Steinberg | G02B 6/4251 385/88 |
| 7,346,242 | B2* | 3/2008 | Morlion | G02B 6/30 385/91 |
| 8,457,454 | B1* | 6/2013 | Roy | G02B 6/4279 385/33 |
| 9,011,020 | B2* | 4/2015 | Ty Tan | G02B 6/30 385/53 |
| 9,014,519 | B2* | 4/2015 | Mathai | G02B 6/4249 385/88 |
| 10,018,781 | B1* | 7/2018 | Masuda | G02B 6/4239 |
| 10,054,737 | B2* | 8/2018 | Kobrinsky | H01L 23/49827 |
| 10,466,428 | B2* | 11/2019 | Yanagisawa | G02B 6/4214 |
| 10,823,912 | B1* | 11/2020 | Pelc | G02B 6/132 |
| 10,996,401 | B2* | 5/2021 | Mentovich | G02B 6/30 |
| 2013/0094865 | A9* | 4/2013 | Pinguet | G02B 6/43 398/164 |
| 2014/0023315 | A1* | 1/2014 | Takai | G02B 6/4253 385/14 |
| 2015/0277066 | A1 | 10/2015 | Nakagawa et al. | |
| 2015/0293305 | A1* | 10/2015 | Nakagawa | G02B 3/0006 29/428 |
| 2016/0131861 | A1 | 5/2016 | Ma et al. | |
| 2016/0291268 | A1* | 10/2016 | Shimura | G02B 6/4246 |
| 2016/0341902 | A1* | 11/2016 | Wang | G02B 6/43 |
| 2017/0315299 | A1* | 11/2017 | Mathai | G02B 6/34 |
| 2018/0180829 | A9* | 6/2018 | Gudeman | H01S 5/02255 |
| 2018/0259728 | A1* | 9/2018 | Cyr | G02B 6/4238 |
| 2019/0219777 | A1 | 7/2019 | Yakabe et al. | |
| 2020/0365544 | A1* | 11/2020 | Chen | H01L 24/17 |
| 2021/0202562 | A1* | 7/2021 | Chang | G02B 6/43 |

FOREIGN PATENT DOCUMENTS

| | | |
|---|---|---|
| JP | 2016-91023 A | 5/2016 |
| WO | 2018/042984 A1 | 3/2018 |

OTHER PUBLICATIONS

Takanori Suzuki et al., *Cost-Effective Optical Sub-Assembly Using Lens-Integrated Surface-Emitting Laser*, Journal of Lightwave Technology, vol. 34, No. 2, Jan. 15, 2016, pp. 358-364.

Shigeki Makino et al., *A 40-Gbit/s MMF Transmission with 1.3-$\mu m$ Lens-Integrated EA/DFB Lasers for Optical Interconnect*, OFC/NFOEC Technical Digest, Mar. 4, 2012, pp. 1-3.

\* cited by examiner

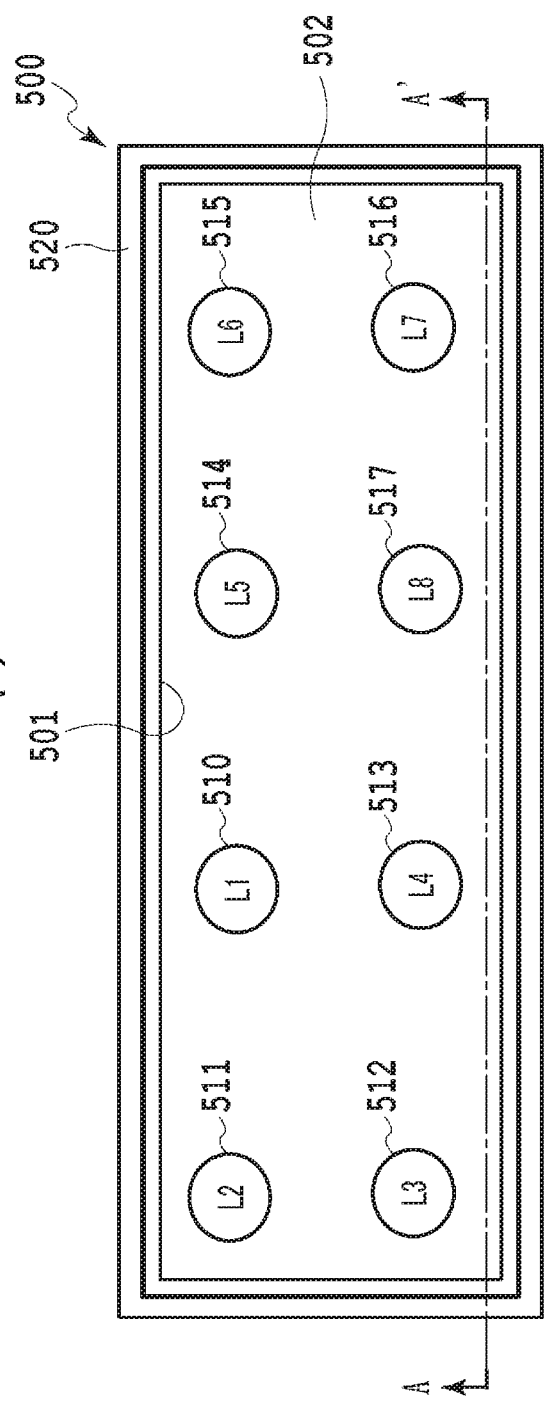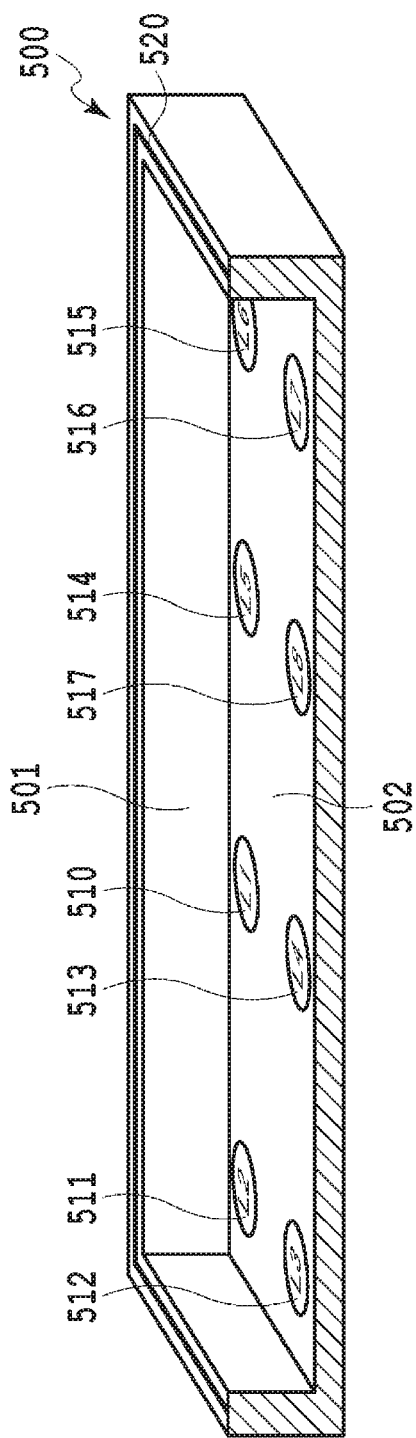

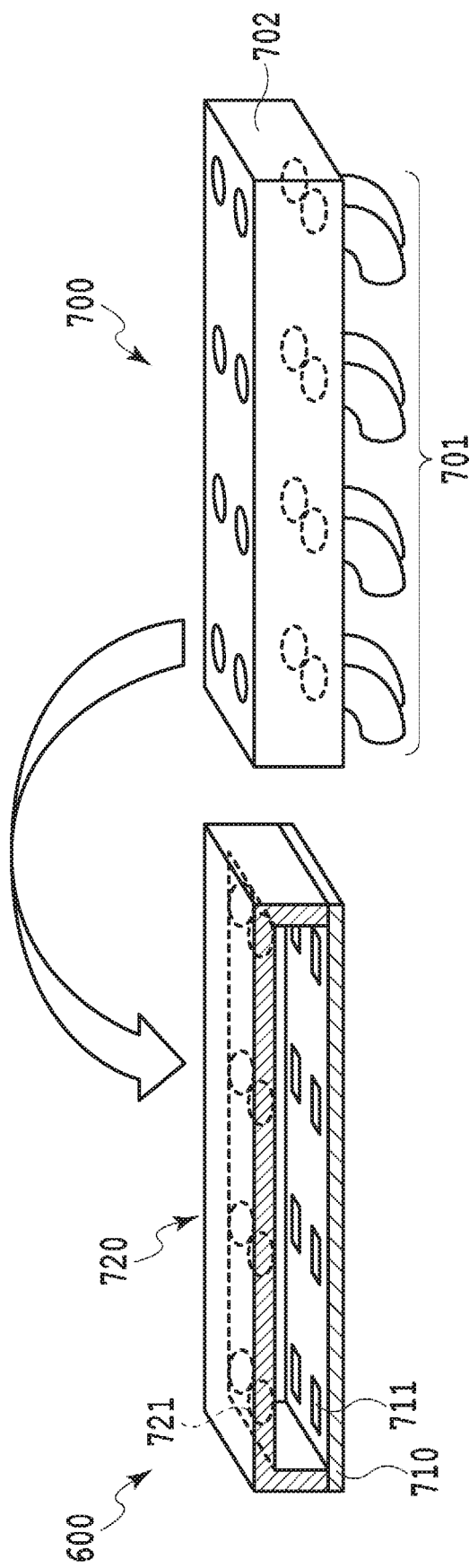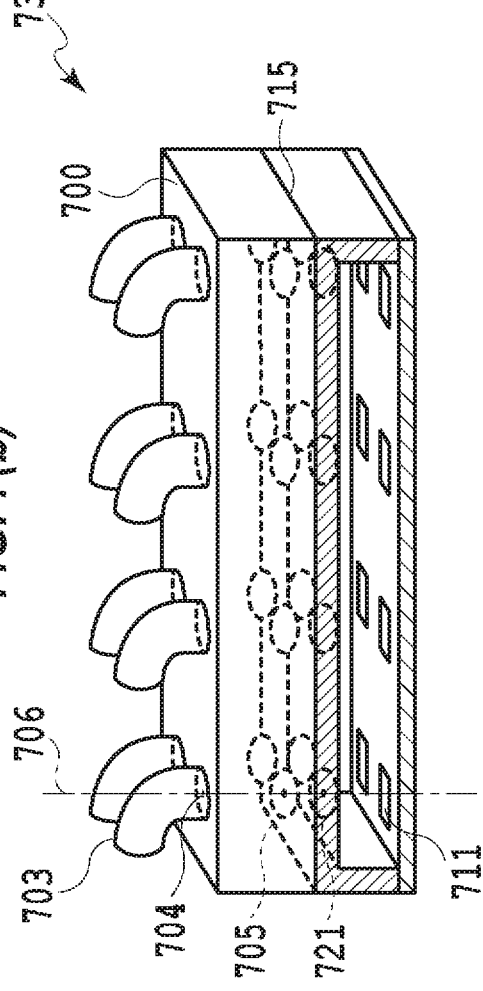

OPTICAL MODULE, OPTICAL WIRING SUBSTRATE, AND METHOD FOR MANUFACTURING OPTICAL MODULE

TECHNICAL FIELD

The present invention relates to a package structure of and a packaging method for an optical module. In particular, the invention relates to an optical wiring structure of an optical module in on-board optics.

BACKGROUND ART

In general, a set of components (a light source, a modulator, a photodetector, or an electrical circuit associated with such a component) of an optical transceiver used for optical communications is integrated, mounted and packaged according to a form factor standard such as that represented by the CFP (Centum gigabit Form factor Pluggable) standard.

FIG. 1 illustrates a configuration of a conventional optical transceiver 100 (FIG. 1(*a*)) and a configuration of a communication device 110 incorporating the optical transceiver (FIG. 1(*b*)). The communication device 110 implemented in this way has an advantage that it is easy to maintain.

For example, as shown in FIG. 1(*b*), the communication device 110 incorporates a plurality of optical transceivers 100, each of which is a package of a set of optical components, in a front end part thereof. When a component of the optical transceiver 100 fails or has aged, such as when a transmission optical fiber 101 or a reception optical fiber 102 is broken, when an element in a photodetector 104 is damaged, or when a component of an electronic circuit of a control circuit 106 has degraded, the optical transceiver 110 having the failed or aged component can be selectively removed from the communication device 110 and replaced with a new normal optical transceiver to keep the normal operation of the communication device 110.

Also known is another process of implementing an optical module in a communication device referred to as an on-board optics (abbreviated as OBO hereinafter) process (referred to as an OBO process hereinafter). In the OBO process, a set of components to form an optical module is directly mounted on a printed circuit board in a communication device, instead of previously packaging a set of components to form an optical transceiver as an optical module and then mounting the optical module in a communication device as shown in FIG. 1.

FIG. 2 shows an example of a configuration of a communication device 200, which is what the communication device 110 incorporating optical transceivers shown in FIG. 1(*b*) would be if it is configured in the OBO process. With the communication device 200, optical transceivers are not previously packaged as integral modules, and sets of components including a modulator 213, a photodetector 214, a light source 215 and a control circuit 216 are mounted on a mounting substrate 210 and performs a function as optical transceivers.

A first advantage of the OBO process is that each of a plurality of optical modules does not have to be packaged, so that the number of components and thus the implementation cost are reduced, and therefore the communication device can be manufactured at lower cost.

Since the optical transceivers in the communication device 200 are not packaged as optical modules as shown in FIG. 2, attachment or detachment of an optical module to or from the communication device 200 cannot occur. Therefore, the set of components (the modulator 213, the photodetector 214, the light source 215 and the control circuit 216) of an optical transceiver does not have to be one-dimensionally arranged along one edge of the mounting substrate 210 in the communication device 200. That is, the set of components 213, 214, 215 and 216 of an optical transceiver can be two-dimensionally arranged in any part on the mounting substrate 210.

A second advantage of the OBO process is that since the two-dimensional arrangement is possible, the packaging density of the sets of components of the optical modules on the mounting substrate 210 can be increased and thus the communication device 200 can be downsized, and that arrangement of the sets of components of the optical modules on the mounting substrate 210 can be appropriately adjusted, and therefore the efficiency of thermal management of the communication device 200 can be improved and thus the power consumption of the communication device 200 can be reduced.

The OBO process has three technical requirements. A first technical requirement is that, in order to achieve two-dimensional surface mounting of a set of components of an optical module on a mounting substrate in a communication device, each component has to have a substantially planar part that allows mounting of the component such as a ball grid array (BGA) and that each component has to resist the heat in the reflow step or, in other words, have a reflow heat resistance.

A second technical requirement is that, from the viewpoint of preventing misalignment of the set of components mounted, accurate self-alignment has to be achieved in the reflow step.

A third technical requirement is that the optical coupling between the optical module and the mounting substrate has to be able to be achieved at low cost, as with the electrical coupling between the optical module and the mounting substrate, which is simply achieved in a packaging method using BGA or the like.

To meet the three technical requirements of the OBO process described above, a packaging method based on Wafer Level Packaging (abbreviated as WLP hereinafter) is used. The WLP-based packaging method is a packaging method that involves mounting a set of components on a semiconductor wafer and then cutting the part including the set of components as a semiconductor chip, rather than cutting a semiconductor chip out of a semiconductor wafer and then mounting a set of components on the semiconductor chip.

For example, a semiconductor chip on which an optical module is implemented can be produced by mounting a set of components of the optical module in an appropriate arrangement on a semiconductor wafer and then appropriately cutting the optical module out of the semiconductor wafer.

FIG. 3 shows an example of a package structure of an optical module 300 that is fabricated in the WLP-based packaging method and implemented on a mounting substrate 301 in the OBO process.

The optical module 300 includes an optical control circuit 333 and a Si optical circuit 330. The Si optical circuit 330 uses silicon (Si) as a semiconductor and includes the optical control circuit 333, which is produced by mounting a modulator and other components on a semiconductor wafer and then cutting the part including the components as a semiconductor chip. The optical module 300 and the mounting substrate 301 need to be electrically connected to each other.

On the mounting substrate 301, two electrical circuits 1 and 2 (denoted as 312) sealed with a resin sealant 310 are implemented as BGA packages including solder bumps or balls 302 and electrically connected to the mounting substrate 301.

A laser diode 320 for photoelectric conversion is electrically connected to the electrical circuits 1 and 2 (312) by electrical wiring passing through the resin sealant 310.

In order that laser light 321 emitted from the laser diode 320 can be input to the optical control circuit 333, the optical module 300 is bonded to the top of the resin sealant 310 with an adhesive 303.

The optical module 300 outputs an optical signal through an optical fiber 331. The optical fiber 331 is fixed by an optical fiber fixing structure 332, which is held between the resin sealant 310 and the Si optical circuit 330, and is optically connected to the Si optical circuit 330.

CITATION LIST

Non-Patent Literature

Non-Patent Literature 1: Takanori Suzuki, Koichiro Adachi, Aki Takei, Kohichi R. Tamura, Akira Nakanishi, Kazuhiko Naoe, Tsukuru Ohtoshi, Kouji Nakahara, Shigehsa Tanaka, and Kazuhisa Uomi, "Cost-Effective Optical Sub-Assembly Using Lens-Integrated Surface-Emitting Laser", J. Ligtw. Technol., vol. 34 No. 2, p. 358 (2016)

SUMMARY OF THE INVENTION

Technical Problem

According to the WLP-based packaging method for an optical module illustrated in FIG. 3, the optical fiber 331 is fixed at an end face of the Si optical circuit 330 forming the optical module 300, and is optically connected to the optical module 300. Therefore, the number of optical fibers 331 that can be connected to one optical module 300, that is, one semiconductor chip is limited by the size of the optical module 300.

Furthermore, the optical fiber 331 can be connected to the optical module 300 only at the end face of the Si optical circuit 330. Therefore, when a plurality of optical fibers 331 is connected to the optical module 300, the arrangement of the optical fibers is limited to a one-dimensional arrangement. For this reason, an advantage of the OBO process, that is, the flexibility of arrangement of the set of components of the optical module, is reduced.

In short, the conventional WLP-based packaging method cannot meet the technical requirements of the OBO process and achieve the advantage of the OBO process at the same time.

By the way, in recent years, a package structure has been proposed in which an optical module is arranged with an input/output part for an optical signal facing in a direction perpendicular to the direction of extension of a mounting substrate.

For example, Non-Patent Literature 1 discloses a structure in which laser light propagating in a horizontal waveguide in a semiconductor chip forming a surface emitting laser is reflected in the vertical direction by a reflection mirror provided in the semiconductor laser chip to make the laser light be incident on an optical fiber provided at one side in the direction perpendicular to the direction of the waveguide in the semiconductor chip (Non-Patent Literature 1).

Means for Solving the Problem

The inventors have adapted the configuration of the semiconductor chip disclosed in Non-Patent Literature 1, to devise from the configuration a novel configuration of an optical module provided with a lid including a lens and a member including an optical fiber incorporated with an end face thereof exposed, and completed the present invention.

The present invention has been devised to solve the problems described above. Specifically, the present invention provides an optical module that is implemented by WLP in the OBO process and has a two-dimensional flexibility of the location at which the optical module is connected to an optical fiber, an optical wiring substrate therefor, and a method of manufacturing the same optical module.

An optical module according to an embodiment of the present invention includes: a substrate; one or more light sources that produce light, which is an optical signal; one or more light reflection units that changes a direction of travel of the light to a direction substantially perpendicular to the substrate; one or more optical waveguides that optically connect the one or more light sources and the one or more light reflection units to each other; and a lid that is attached to the substrate to cover the one or more light sources, the one or more light reflection units and the one or more optical waveguides.

In the embodiment, the lid has one or more lenses that collimate light directed by the one or more light reflection units and transmit the light to the outside of the lid.

A method of manufacturing an optical module according to an embodiment of the present invention includes: a first step of mounting a light source, a light reflection unit and an optical waveguide that form the optical module; a second step of, after the first step, attaching a lid having a lens to the substrate in such a manner that the lid covers the light source, the light reflection unit and the optical waveguide; and a third step of, after the second step, cutting a die containing at least one lid out of the substrate as the optical module.

Effects of the Invention

As described above, according to the present invention, the most can be made of the advantage of the OBO process, that is, the flexibility of arrangement of an optical module on a mounting substrate.

BRIEF DESCRIPTION OF DRAWINGS

FIG. 1(*a*) shows a configuration of the optical transceiver, and FIG. 1(*b*) shows a configuration of the communication device that incorporates the optical transceiver packaged as a module in advance.

FIG. 4(*a*) is a top view of the semiconductor chip 400, and FIG. 4(*b*) is a perspective view of the semiconductor chip 400.

FIG. 5 includes schematic diagrams showing a lid 500 that covers the semiconductor chip 400. FIG. 5(*a*) is a top view of the lid 500, and FIG. 5(*b*) is a perspective view of a cross section of the lid 500 taken along the line A-A' in FIG. 5(*a*).

FIG. 7 includes schematic diagrams showing an optical module 730 with an optical fiber array, which is formed by connecting the lidded optical module 600 and an optical fiber array block 700 to each other. FIG. 7(*a*) shows a positional relationship between the lidded optical module 600 (schematically shown in cross section) and the optical fiber array block 700 at the time when the optical fiber array block 700 is connected to the lidded optical module 600. FIG. 7(*b*) shows a positional relationship between the lidded optical module 600 (schematically shown in cross section) and the optical fiber array block 700 connected to each other.

FIG. 8(*a*) is a top view of the package structure, FIG. 8(*b*) is a perspective view of the package structure, and FIG. 8(*c*) is a schematic side cross-sectional view of the package structure.

DESCRIPTION OF EMBODIMENTS

First Embodiment

As a first embodiment of the present invention, an optical module will be described. As an example of the optical module, a multi-channel transmission light source (abbreviated as MCT hereinafter) that inputs different optical signals to a plurality of optical fibers for transmission will be described.

Figure 1A:
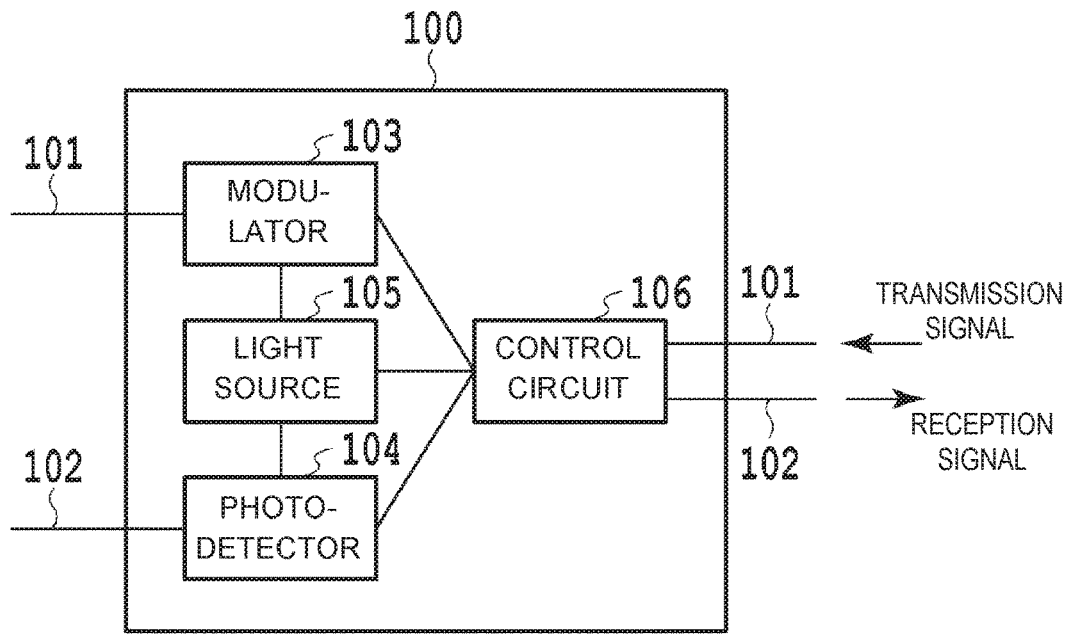
FIG. 1 includes schematic diagrams showing a configuration of a conventional optical transceiver and a configuration of a communication device incorporating the optical transceiver.
Figure 1B:
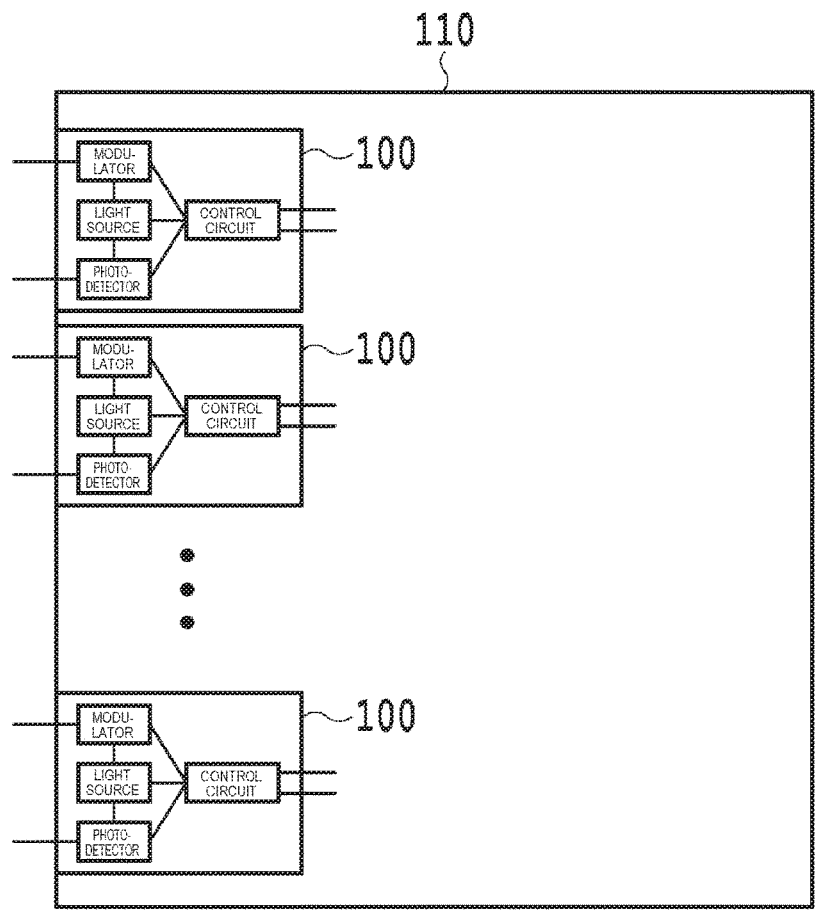
Figure 2:
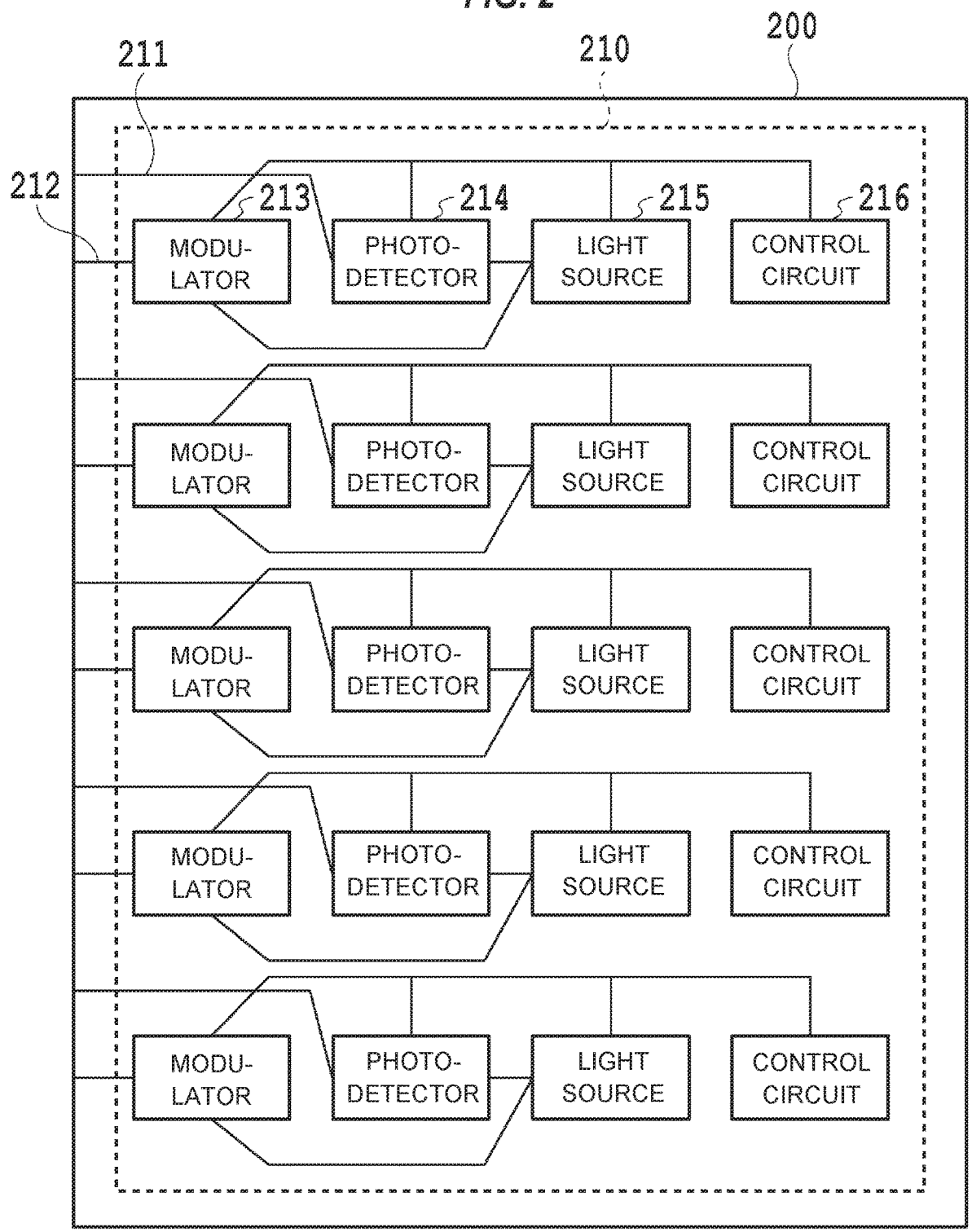
FIG. 2 is a schematic diagram showing a configuration of a communication device that incorporates an optical transceiver implemented in an OBO process.
Figure 3:
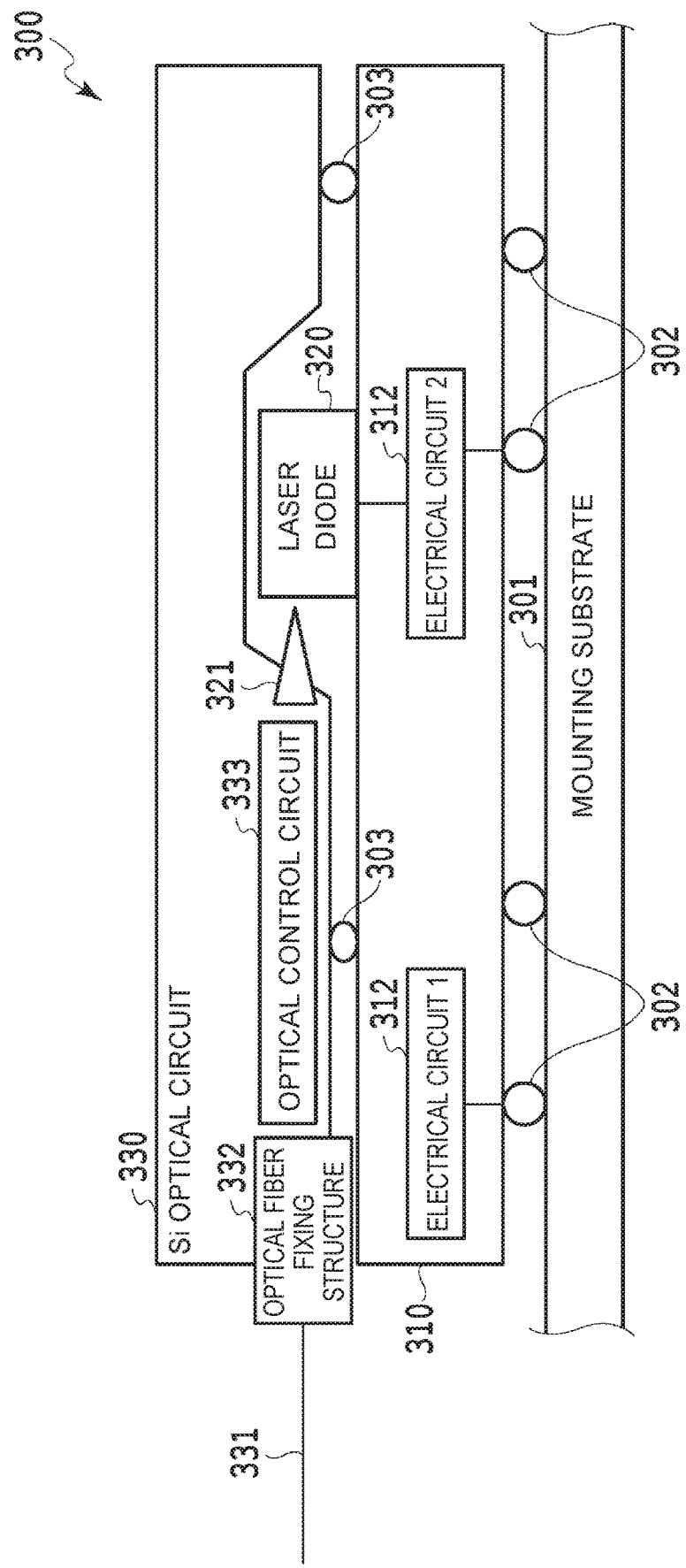
FIG. 3 is a schematic diagram showing a package structure of an optical module that is fabricated in a WLP-based packaging method and implemented on a mounting substrate in the OBO process.
Figure 4A:
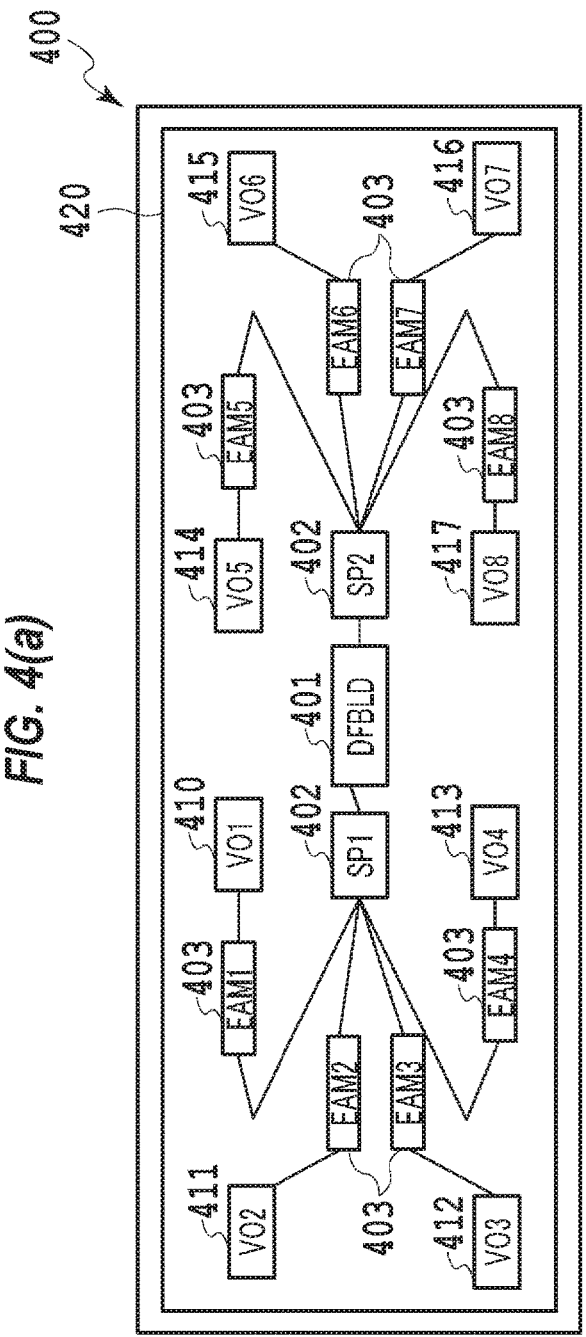
FIG. 4 includes schematic diagrams showing a semiconductor chip 400 on which a set of components of a multi-channel transmission light source is mounted.
Figure 4B:
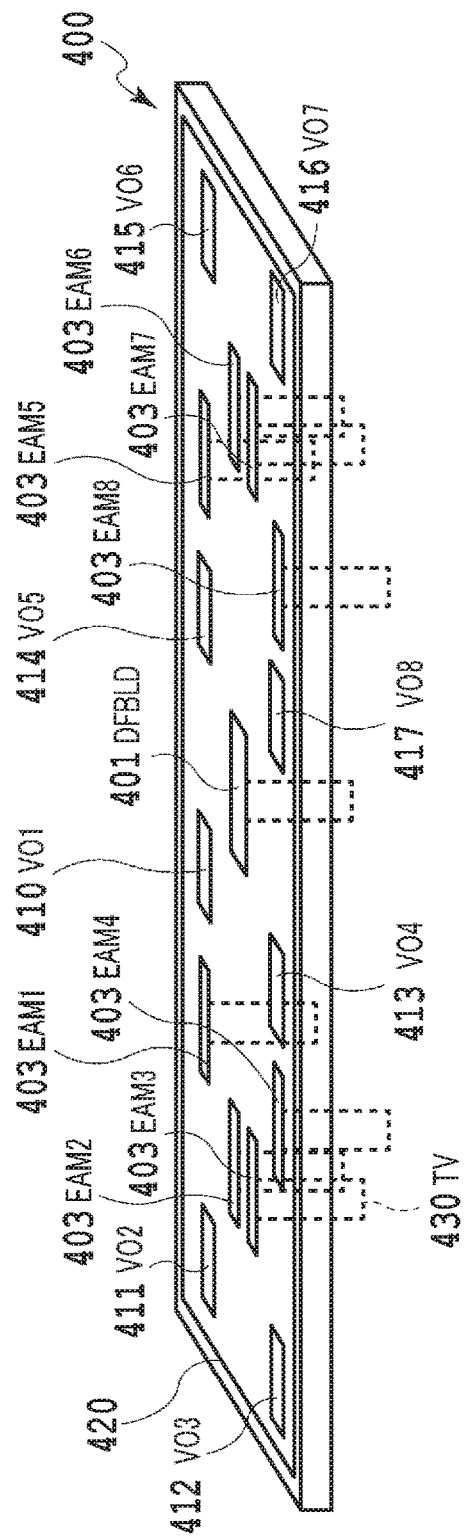

FIG. 4 includes schematic diagrams showing a configuration of the MCT, which will be described as the optical module in this embodiment. FIG. 4(*a*) is a top view of the MCT, and FIG. 4(*b*) is a perspective view of the MCT.

A semiconductor chip 400 on which the MCT is implemented is fabricated in the WLP-based packaging method by covering a set of components of the MCT mounted on a semiconductor wafer with a lid (denoted by reference numeral 500 in FIG. 5 described later) fabricated in a well-known semiconductor process, and then cutting the part including the set of components out of the semiconductor wafer as the semiconductor chip 400. More specifically, a plurality of sets of components of MCTs (each set including a distributed feedback laser 401, a branching filter 402, an electroabsorption optical modulator 403, light reflection units 410 to 417, and optical wiring that connects these components to each other) is mounted on one semiconductor wafer, a lid is placed to cover the set of components of each MCT, and then the semiconductor wafer is cut into dice each including at least one lid. One of such dice is the semiconductor chip 400.

Note that the configuration of the optical module according to this embodiment described herein can be equally applied when a semiconductor chip is first cut from a semiconductor wafer, and then a set of components of an MCT is mounted on the semiconductor chip and covered with a lid, or when a semiconductor chip is first fabricated in the WLP-based process by packaging a set of components of an MCT and cutting the part including the set of components as a semiconductor chip, and then the semiconductor chip is covered with a lid.

The MCT is fabricated in the WLP-based packaging process by covering the semiconductor chip 400 incorporating the set of components of the MCT with a lid fabricated in a well-known semiconductor process.

The semiconductor chip 400 is an indium phosphide (referred to as InP hereinafter) substrate. The set of components of the MCT on the semiconductor chip 400 includes a distributed feedback laser 401 that oscillates at a wavelength of 1300 nm, branching filters 402 arranged at the opposite ends of the distributed feedback laser 401 each of which branches the laser light emitted from the distributed feedback laser 401 in four directions, electroabsorption optical modulators 403 each of which modulates the amplitude of the laser light input from the branching filter 402, and light reflection units 410 to 417.

The light reflection units 410 to 417 receives laser light from the respective associated electroabsorption optical modulators 403 and function to direct the laser light in a direction perpendicular to the face of the semiconductor chip 400 on which the set of components is mounted. The light reflection units 410 to 417 each can include a mirror and an associated lens, as described in Non-Patent Literature 1. In this case, the light is reflected by the mirror, and the reflected light is directed through the lens in the direction perpendicular to the face of the semiconductor chip 400 on which the set of components is mounted. The laser light from each of the light reflection units 410 to 417 is collimated by a lens, and the collimated light is emitted from the MCT.

The semiconductor chip 400 includes a bonding metal A 420 along and inside the outer circumference on the face on which the set of components of the MCT is mounted. The bonding metal A 420 is a bonding part used when a lid is bonded to the semiconductor chip 400 later in the process.

The bonding metal A 420 is preferably formed by vapor deposition. The bonding metal A 420 is preferably made of gold (Au) as the metal and preferably has the shape of a bump.

The semiconductor chip 400 further includes through vias 430. The through via 430 are conductive members for providing an electric signal to the distributed feedback laser 401 and the electroabsorption optical modulators 403. The through via 430 extends between the face on which the set of components of the MCT is mounted and the opposite face and is electrically connected to the distributed feedback laser 401 or the electroabsorption optical modulator 403.

Although the material of the semiconductor chip 400 is described as being InP in this embodiment, silicon, silicon oxide or other semiconductor materials can also be used as required.

Note that, in the perspective view of FIG. 4(*b*), illustration of optical wiring that connects the branching filters 402 and other components to each other is omitted.

FIG. 5 includes schematic diagrams showing a lid 500. FIG. 5(*a*) is a top view of the lid 500, and FIG. 5(*b*) is a perspective view of a cross section of the lid 500 taken along the line A-A' in FIG. 5(*a*). The lid 500 is a component to cover the semiconductor chip 400 and is made of silicon.

The lid 500 has a recess part 501 that is sized to be capable of covering the semiconductor chip 400 and lenses 510 to 517 on a bottom face 502 of the recess part 501.

The lenses 510 to 517 can be formed by well-known means for forming a semiconductor device on a silicon substrate.

On a top face of a wall that defines the recess part 501 of the lid 500, a bonding metal B 520 is provided along and inside the outer circumference of the top face of the wall. The bonding metal B 520 is a bonding part used when the lid 500 is bonded to the semiconductor chip 400 later in the process.

The bonding metal B 520 is preferably formed by vapor deposition, as with the bonding metal A 420 provided on the semiconductor chip 400. The bonding metal B 520 is preferably made of gold (Au) as the metal and preferably has the shape of a bump, as with the bonding metal A 420.

Figure 6:
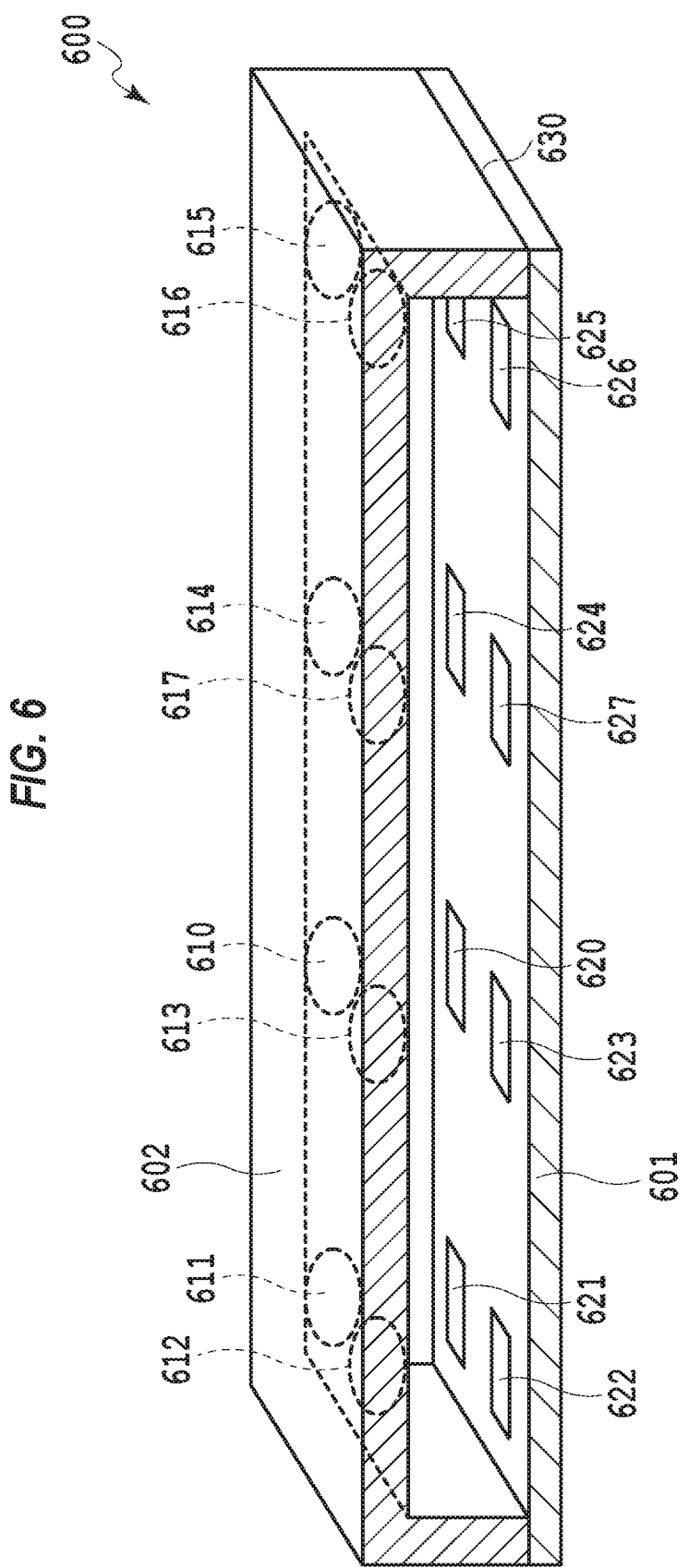
FIG. 6 is a schematic cross-sectional view of a lidded optical module 600, which is the semiconductor chip 400 covered with the lid 500.

FIG. 6 is a schematic cross-sectional view of a lidded optical module 600. The lidded optical module 600 includes a semiconductor chip 601 and a lid 602. The semiconductor chip 601 has the same configuration as the semiconductor chip 400 shown in FIG. 4, and the set of components of the MCT is mounted on the semiconductor chip 601. In the semiconductor chip 601, of the set of components of the MCT, FIG. 6 shows only light reflection units 620 to 627 (which correspond to the light reflection units 410 to 417 in FIG. 4) and does not show the other components. The lid 620 has the same configuration as the lid 500 shown in FIG. 5. Reference numerals 610 to 617 denote lenses (which correspond to the lenses 510 to 517 in FIG. 5).

To fabricate the lidded optical module 600, first, the lid 602 is placed in such a manner that the set of components of the MCT on the semiconductor chip 601 is with covered with the recess part of the lid 602. Then, the bonding metal A of the semiconductor chip 601 and the bonding metal B of the lid 602 are pressed against each other, and an interface 630 between the bonding metals A and B is heat-treated. By the pressing and the heat treatment, the semiconductor chip 601 and the lid 602 can be bonded to each other.

When the semiconductor chip 601 and the lid 602 are bonded to each other, the temperature of the heat treatment performed on the interface 603 is desirably equal to or less than the temperature at the time when the set of components of the MCT is mounted on the semiconductor chip 601. That is, the temperature of the heat treatment is desirably equal to or less than the temperature at the time when the optical module is implemented on the semiconductor chip 601. By controlling the temperature in this way, the mechanical strength and the electrical stability of the bonding between the set of components of the optical module and the semiconductor chip 601 can be ensured, and therefore the stable operation of the optical module can be ensured.

In this embodiment, the material of the semiconductor chip 601 is InP. In this case, the temperature of the heat treatment for bonding the semiconductor chip 601 and the lid 602 to each other is desirably equal to or less than 300° C. In order to perform the heat treatment at lower temperatures, ultrasonic bonding can be used. If the ultrasonic bonding is used, the upper limit of the temperature of the heat treatment for the bonding can be reduced from 300° C. to 150° C. Specifically, by applying a local ultrasonic vibration and pressure to the interface 603, the bonding metal A 420 of the semiconductor chip 601 and the bonding metal B 520 of the lid 602 can be instantly made molten and bonded to each other.

FIG. 7 includes schematic diagrams showing an optical module 730 with an optical fiber array, which is formed by connecting the lidded optical module 600 and an optical fiber array block 700 to each other. FIG. 7(*a*) shows a relationship between connection faces of the lidded optical module 600 (a semiconductor chip 710 and a lid 720 of which are shown in cross section) and the optical fiber array block 700 at the time when the optical fiber array block 700 is connected to the lidded optical module 600. FIG. 7(*b*) shows a positional relationship between the lidded optical module 600 and the optical fiber array block 700 connected to each other.

The semiconductor chip 710 has the same configuration as the semiconductor chip 400 shown in FIG. 4 and the semiconductor chip 601 shown in FIG. 6, and the set of components of the MCT is mounted on the semiconductor chip 710. As with the semiconductor chip 601 shown in FIG. 6, only eight light reflection units (only a representative one of which is denoted by reference numeral 711) are shown, and illustration of the other components is omitted. The lid 720 has the same configuration as the lid 500 shown in FIG. 5 and the lid 602 shown in FIG. 6. Eight lenses are provided, only a representative one of which is denoted by reference numeral 721.

Although the lidded optical module 600 is shown in cross section, in actuality, the eight light reflection units provided on the semiconductor chip 710 are enclosed by the lid 720.

The optical fiber array block 700 includes a block 702 and a plurality of optical fibers 701 attached to the block 702 so as to pass through the block 702. End faces of the plurality of optical fibers 701 are exposed on the face of the block 702 to be connected to the lid 720. The plurality of optical fibers 701 extend out of a face of the block 702 that is not to be connected to the lid 720.

The block 702 is preferably made of silicon oxide, for example.

The plurality of optical fibers 701, which extend out of the block 702, are intended to optically connect the optical module 730 with an optical fiber array and a mounting substrate (a package structure 801 shown in FIG. 8 described below) to each other when the optical module 730 with an optical fiber array is mounted on the mounting substrate. All of the plurality of optical fibers 701 may be multi-mode optical fibers or single-mode optical fibers, or some of the plurality of optical fiber 701 may be multi-mode optical fibers, and the others may be single-mode optical fibers. A core part of the plurality of optical fibers 701 may be made of silicon oxide, a translucent resin or other translucent material, which can be appropriately chosen depending on the application of the optical module 730 with an optical fiber array.

To connect the optical fiber array block 700 to the lidded optical module 600, the outer face of the lid 720 that is horizontal along the direction of extension of the semiconductor chip 710 and the face of the block 702 on which the end faces of the plurality of optical fibers 701 are exposed are brought into intimate contact with each other, and the faces brought into intimate contact with each other, which are referred to as bonding faces 715, are bonded to each other.

The bonding faces 715 are bonded to each other with bonding metals provided on both the lid 720 and the block 702 as in the case of bonding the semiconductor chip 710 and the lid 720 to each other, or with an adhesive containing an organic matter.

In the optical module 730 with an optical fiber array, the light reflection units 711, the lenses 721, the end faces 705 of the optical fibers 703 on the bonding face 715, and cross section 704 of the optical fibers 703 at the outer face opposite to the bonding face 715 are arranged in such a manner that an axis 706 perpendicular to the direction of extension of the semiconductor chip 710 passes through one each of them. Since the laser light directed by the light reflection unit 711 is collimated through the lens 721 as described above, the light reflection unit 711, the lens 721, the end face 705 of the optical fiber 703 and the cross section 704 of the optical fiber 703 are arranged in such a manner that the optical axis of the lens 721 passes through the center of the end face 705 of the optical fiber 703 and the center of the core of the cross section 704 of the optical fiber 703.

Although eight light reflection units, eight lenses and eight optical fibers 701 have been illustrated in this embodiment, the arrangement described above can be applied to any number of light reflection units 711, any number of lenses 721 and any number of optical fibers 701.

This arrangement allows optical coupling between any number of light reflection units 711 mounted on the semiconductor chip 710 and the same number of optical fibers 701.

Second Embodiment

As a second embodiment, an optical wiring board that includes a printed circuit board (abbreviated as PCB hereinafter) 801 and an MCT 802 with an optical fiber array, which is the optical module with an optical fiber array fabricated in the first embodiment described above, mounted on the PCB 801 will be described.

Figure 8A:
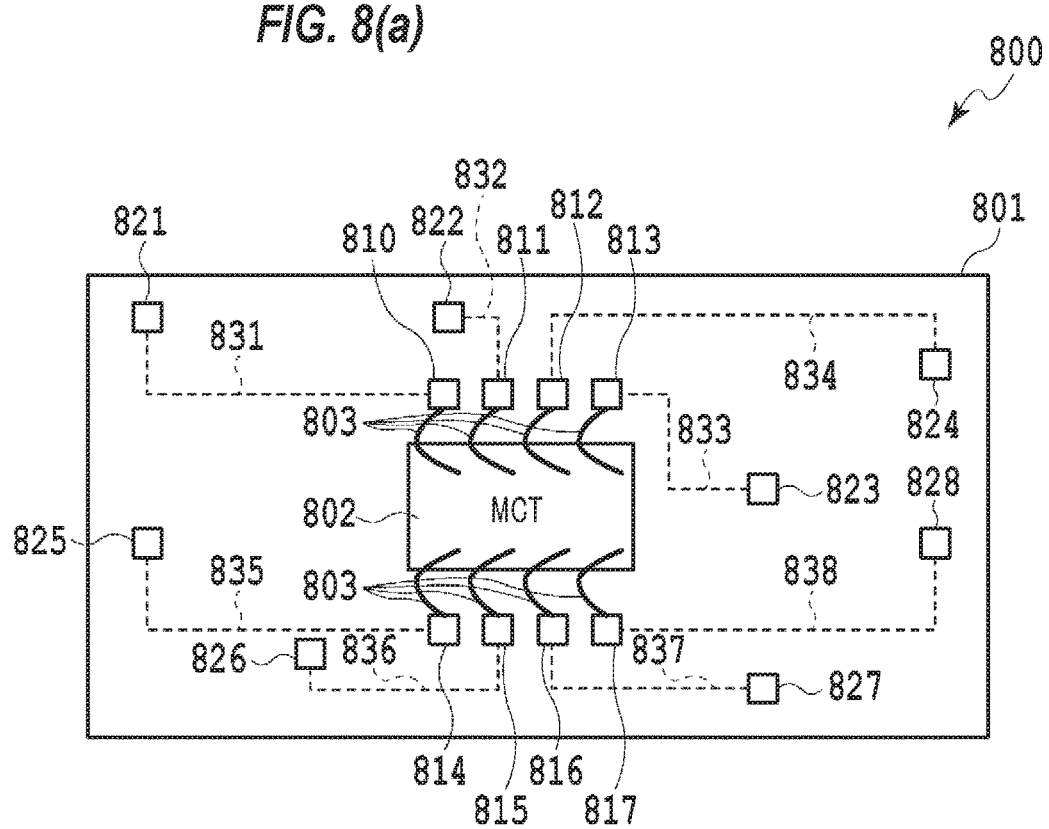
FIG. 8 includes schematic diagrams showing a package structure in which a multi-channel optical transmitter 802 with an optical fiber array is mounted on a printed circuit board 801.
Figure 8B:
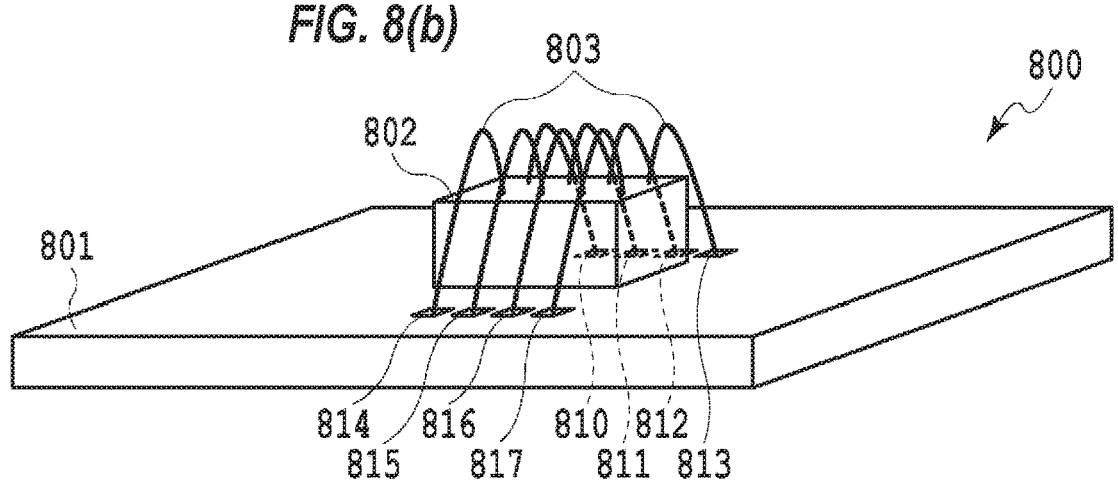
Figure 8C:
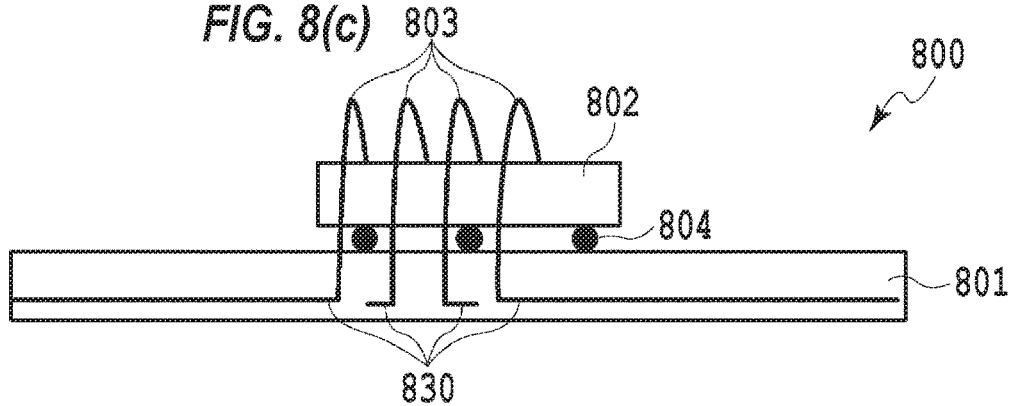

FIG. 8 includes schematic diagrams showing a package structure in which the multi-channel optical transmitter 802 with an optical fiber array is mounted on the PCB 801. FIG. 8(a) is a top view of the package structure, FIG. 8(b) is a perspective view of the package structure, and FIG. 8(c) is a schematic side cross-sectional view of the package structure.

In this embodiment, the MCT 802 with an optical fiber array is surface-mounted on the PCB 801. A plurality of optical fibers 803 extend out of the top of the MCT 802 with an optical fiber array and are optically connected to optical fiber connectors 810 to 817 provided on the PCB 801.

The MCT 802 with an optical fiber array and the PCB 801 are electrically connected to each other by a through via (not shown in FIG. 8) provided in the semiconductor chip in the MCT 802 with an optical fiber array and a bump structure 804 electrically connected to the through via.

The PCB 801 is provided with the same number of optical fiber connectors 810 to 817 as the number of optical fibers 803 extending out of the top of the MCT 802 with an optical fiber array. Laser light emitted from the MCT 802 with an optical fiber array and is incident on the optical fiber connectors 810 to 817 through the plurality of optical fibers 803 propagates in optical wires 831 to 838 provided on the surface of or inside the PCB 801. The optical wiring 830 shown in FIG. 8(c) represents the optical wires 831 to 838 provided inside the PCB 601. The laser light propagating in the optical wires 831 to 838 propagates to optical connectors 821 to 828 provided at different locations on the PCB 801 and then is output to the outside of the PCB 801 from the optical connectors 821 to 828.

For example, when laser light output from the MCT 802 with an optical fiber array is input to the optical fiber connector 810 through one of the plurality of optical fibers 803, the laser light propagates in the optical wire 831 and is output to the outside of the PCB 801 from the optical connector 821 associated with the optical fiber connector 810.

FIG. 8 shows an example in which the optical fiber connectors 810 to 817 are provided in the vicinity of the location of the mounted MCT 802 with an optical fiber array to optically connect the MCT 802 with an optical fiber array and the PCB 801 to each other. According to the present invention, however, the relationship between the location of the MCT 802 with an optical fiber array and the locations of the optical fiber connectors 810 to 817 on the PCB 801 is not particularly limited, and the optical fiber connectors 810 to 817 can be provided at any locations on the PCB 801 as far as the laser light is output from the associated optical connectors 821 to 828.

As is obvious, according to this embodiment, by providing the optical wiring 830 (optical wires 831 to 838) on the surface of or inside the PCB 801, any two-dimensional or three-dimensional optical circuit can be designed without limitation on the orientation or the number of wires.

Reference Signs List

100 Conventional optical transceiver
101, 211 Transmission optical fiber
102, 212 Reception optical fiber
103, 213 Modulator
104, 214 Photodetector
105, 215 Light source
106, 216 Control circuit
110 Communication device provided with conventional optical transceiver 100
200 Communication device configured in OBO process
210 Mounting substrate
300 Optical module
301 Mounting substrate on which optical module 300 is implemented
302 Solder bump or solder ball
303 Adhesive
310 Resin sealant
312 Electrical circuit 1, 2
320 Laser diode
321 Laser light emitted from laser diode 320
330 Si optical circuit
331, 703 Optical fiber
332 Optical fiber fixing structure
333 Optical control circuit
400, 601, 710 Semiconductor chip
401 Distributed feedback laser
402 Branching filter
403 Electroabsorption optical modulator
410, 411, 412, 413, 414, 415, 416, 417, 621, 622, 623, 624, 625, 626, 627, 711 Light reflection unit
420 Bonding metal A
430 Through via
500, 602, 720 Lid
501 Recess part
502 Bottom face of recess part 501
510, 511, 512, 513, 514, 515, 516, 517, 610, 611, 612, 613, 614, 615, 616, 617, 721 Lens
520 Bonding metal B
600 Lidded optical module
630 Interface between bonding metal A 420 and bonding metal B 520
700 Optical fiber array block
701, 803 Plural optical fibers
702 Block
704 Cross section of optical fiber 703 on outer face opposite to bonding face 715
705 End face of optical fiber 703
706 axis perpendicular to direction of extension of semiconductor chip 710
715 bonding face
730 Optical module with optical fiber array
800 Package structure in which MCT 802 with optical fiber array is mounted on printed circuit board 801

801 Printed circuit board
802 MCT with optical fiber array
804 Bump structure electrically connected to through via
810, 811, 812, 813, 814, 815, 816, 817 Optical fiber connector
821, 822, 823, 824, 825, 826, 827, 828 Optical connector
830, 831, 832, 833, 834, 835, 836, 837, 838 Optical wiring/Optical wire

The invention claimed is:

1. An optical module that performs conversion between an optical signal and an electrical signal, comprising:
   a substrate;
   one or more light sources that produce light, which is the optical signal;
   a first branching filter optically connected to the one or more light sources by an optical wire;
   a second branching filter optically connected to the one of more light sources by an optical wire, the first and second branching filers being arranged on opposite ends of the one or more light sources;
   a first plurality of electroabsorption filters that are optically connected to the first branching filter by an optical wire,
   a second plurality of electroabsorption filters that are optically connected to the second branching filter by an optical wire;
   a first plurality of light reflection units that change a direction of travel of the light to a direction substantially perpendicular to the substrate, the first plurality of light reflection units each being optically connected to an individual electroabsorption filter of the first plurality of electroabsorption filters by an optical wire;
   a second plurality of light reflection units that change a direction of travel of the light to a direction substantially perpendicular to the substrate, the second plurality of light reflection units each being optically connected to an individual electroabsorption filter of the second plurality of electroabsorption filters by an optical wire, and
   a lid that is attached to the substrate via a metal bonding material, the lid defining a recess part that is sized to cover the one or more light sources, the first and second branching filters, the first and second plurality of electroabsorption filters, the first and second plurality of light reflection units and the optical wires,
   wherein the recess part of the lid has a bottom face that faces the substrate, the bottom face having a plurality of lenses that collimate light directed by the first and second pluralities of light reflection units and transmit the light to the outside of the lid, wherein the plurality of lenses face the substrate and each individual lens of the plurality of lenses corresponds to an individual light reflection unit of the first and second pluralities of light reflection units.

2. The optical module according to claim 1, further comprising:
   an optical fiber array block on which the light transmitted through the plurality of lenses is incident,
   the optical fiber array block having one or more optical fibers that are arranged to have end faces opposed to one or more lenses on a first face of the optical fiber array block and to extend out of a second face of the optical fiber array block.

3. An optical wiring board on which the optical module as recited in claim 2 is implemented,
   wherein the optical module and the optical wiring board are optically connected to each other by an optical fiber extending from the optical fiber array block.

4. The optical wiring board according to claim 3, wherein one or more optical wires for guiding the light are provided on a surface of or inside the optical wiring board.

5. A method of manufacturing an optical module that performs conversion between an optical signal and an electrical signal, the method comprising:
   a first step of mounting a light source, a branching filter, an electroabsorption filter, a light reflection unit and an optical wire that form the optical module on a substrate;
   a second step of, after the first step, attaching using metal bonding material a lid having a lens to the substrate in such a manner that a recess part of the lid is sized to cover the light source, the branching filter, the electroabsorption filter, the light reflection unit and the optical wire, wherein the recess part of the lid has a bottom face that faces the substrate, the bottom face including the lens such that the lens faces the substrate; and
   a third step of, after the second step, cutting a die containing at least one lid out of the substrate as the optical module.

6. The method of manufacturing an optical module according to claim 5, further comprising a step of, after the third step, bonding an optical fiber array block, which fixes one or more optical fibers, to the lid in such a manner that an optical fiber of the one or more optical fibers has an end face opposed to lens on a first face of the optical fiber array block and extends out of a second face of the optical fiber array block.

* * * * *